(12) United States Patent
Lutz et al.

(10) Patent No.: US 7,098,519 B2
(45) Date of Patent: Aug. 29, 2006

(54) AVALANCHE RADIATION DETECTOR

(75) Inventors: Gerhard Lutz, Munich (DE); Rainer H. Richter, Munich (DE); Lothar Struder, Munich (DE)

(73) Assignee: Max-Planck-Gesellschaft zur Forderung der Wissenchafter E.V., Munich (DE)

( * ) Notice: Subject to any disclaimer, the term of this patent is extended or adjusted under 35 U.S.C. 154(b) by 0 days.

(21) Appl. No.: 11/127,660

(22) Filed: May 10, 2005

(65) Prior Publication Data

US 2005/0258449 A1 Nov. 24, 2005

(30) Foreign Application Priority Data

May 10, 2004 (DE) .................. 10 2004 022 948

(51) Int. Cl.
*H01L 31/107* (2006.01)
*H01L 29/80* (2006.01)
*H01L 31/0288* (2006.01)
*H01L 31/112* (2006.01)

(52) U.S. Cl. .................. 257/438; 257/257; 257/258; 257/263; 257/460; 257/462

(58) Field of Classification Search .................. None
See application file for complete search history.

(56) References Cited

U.S. PATENT DOCUMENTS 4,607,508 A 8/1986 Sando et al.
4,654,678 A * 3/1987 Lightstone et al. ......... 257/438
4,729,963 A * 3/1988 Tabatabaie .................. 438/59
5,057,891 A 10/1991 Torikai
6,858,463 B1 * 2/2005 Bond ......................... 438/82

FOREIGN PATENT DOCUMENTS

| DE | 1 577 633 | 3/1970 |
| EP | 0 003 790 | 9/1979 |
| EP | 0 173 519 | 3/1986 |
| GB | 2 072 052 | 9/1981 |
| JP | 10284754 A | 10/1998 |

OTHER PUBLICATIONS

Curt Rint: "Handbuch fur Hochfrequenz-und Elektrotechniker", 12. Auglage, Huthig und Pflaum Verlag Munchen/Heidelberg, p. 478.

* cited by examiner

*Primary Examiner*—Ngân V. Ngô
(74) *Attorney, Agent, or Firm*—Gallagher & Kennedy, P.A.; Thomas D. MacBlain

(57) ABSTRACT

The invention relates to an avalanche radiation detector comprising a semiconductor substrate (HK) with a front side (VS) and a back side (RS), an avalanche region (AB) which is arranged in the semiconductor substrate (HK) on the front side (VS) of the semiconductor substrate (HK) and a control electrode (R) for adjusting the electric field strength in the avalanche region (AB). It is proposed that the control electrode (R) is also arranged on the front side of the semiconductor substrate (HK).

27 Claims, 5 Drawing Sheets

AVALANCHE RADIATION DETECTOR

FIELD OF THE INVENTION

The invention relates to an avalanche radiation detector, and more particularly to an avalanche radiation detector of the kind that includes a semiconductor substrate with a front side and a back side, an avalanche region in the semiconductor substrate on the front side thereof, a control electrode for adjusting the electric field strength in the avalanche region, a read-out contact on the front side and a radiation inlet window for the radiation to be detected, arranged on the back side of the semiconductor substrate.

BACKGROUND OF THE INVENTION

An avalanche radiation detector is known for example from Curt Rint: "Handbook for high-frequency and electrical engineers", $12^{th}$ edition, Hüthig und Pflaum Verlag Munich/Heidelberg, page 478, incorporated herein by reference. In this case an avalanche region is located on one side of a planar semiconductor substrate and located on the opposite side is a radiation inlet window for the radiation to be detected, which generates free charge carriers in the semiconductor substrate. The free charge carriers generated by the radiation to be detected are accelerated in the avalanche region by the electric field located there and produce new charge carriers in an avalanche fashion which can be detected as a current flow. The electric field strength in the avalanche region is in this case adjusted by a control electrode which is arranged on the side of the avalanche radiation detector opposite to the avalanche region.

A disadvantage with this arrangement of the control electrode is that as the thickness of the avalanche radiation detector increases and the distance between the control electrode and the opposed avalanche region increases accordingly, corresponding high control voltages must be used to adjust the electric field strength in the avalanche region to the desired value.

However, an exact adjustment of the electric field strength in the avalanche region is important since, if the field strength in the avalanche region is too low, the sensitivity suffers, whereas the noise increases with the electric field strength in the avalanche region since stochastically generated charge carriers can also result in avalanche formation.

The maximum thickness of the known avalanche radiation detector is thus limited by the maximum permissible control voltage at the control electrode. However, in order to achieve the highest possible sensitivity, it is desirable that the avalanche radiation detector has the largest possible volume of photosensitive region which, however, is only possible to a limited extent because of the afore-mentioned thickness limitation. On the other hand, it is difficult to expand the photosensitive region in the lateral direction because large-area avalanche regions are difficult to produce from the production technology point of view due to the required structural accuracy of the pn junctions.

It is thus the object of the invention to provide an avalanche radiation detector which makes it possible to achieve enhanced sensitivity.

SUMMARY OF THE INVENTION

The above object of the invention is solved, starting from the previously described known avalanche radiation detector by providing the control electrode on the front side of the semiconductor substrate.

In accordance with one aspect of this invention, the control electrode for adjusting the electric field strength in the avalanche region is located not on the side of the avalanche radiation detector opposite to the avalanche region, but on the same side as the avalanche region. This has the advantage that as a result of the spatial proximity of the control electrode to the avalanche region, lower control voltages are sufficient to adjust the electric field strength in the avalanche region to the desired value. In addition, this arrangement of the control electrode also has the advantage that the required control voltages to adjust the electric field strength in the avalanche region are not influenced by the thickness of the avalanche radiation detector. The avalanche radiation detector according to the invention can thus be substantially thicker than the known avalanche radiation detector described initially, which results in a correspondingly higher sensitivity because of the enlarged photosensitive region. For example, the thickness of the avalanche radiation detector according to the invention can lie in the range between 30 µm and 1 mm, with any intermediate values within this range being possible.

The control electrode preferably surrounds the avalanche region in a ring shape, whereas the concept of a ring-shaped arrangement of the control electrode is not restricted to a circular or otherwise round configuration of the control electrode but also comprises an angular control electrode which encloses the avalanche region.

Furthermore, an electric drift field is preferably generated in the semiconductor substrate which moves the charge carriers generated by the radiation to be detected inside the semiconductor substrate towards the avalanche region. In this way, the photosensitive region of the semiconductor substrate can be substantially larger than the avalanche region wherein the drift field ensures that all the charge carriers generated inside the photosensitive region reach the avalanche region and there contribute to avalanche formation. This advantageously makes it possible to have a large-volume photosensitive area which contributes to an enhanced sensitivity of the avalanche radiation detector according to the invention.

The drift field to move the charge carriers to the avalanche region is preferably generated by electrode arrangements such as are known in conventional drift detectors. For example, a plurality of collector electrodes which surround the avalanche region and produce the drift field, can be provided for this purpose, the collector electrodes preferably being arranged in a ring shape and substantially concentrically.

The control electrode in the avalanche radiation detector according to the invention is preferably doped according to a first type of doping whereas the semiconductor substrate is doped according to an opposite second type of doping. The first type of doping can, for example, comprise p-doping whilst the second type of doping comprises n-doping. However, it is alternatively also possible for the first type of doping to be n-doping whilst the second type of doping is p-doping.

In the avalanche radiation detector according to the invention, the radiation to be detected enters into the radiation detector through a radiation inlet window, said radiation inlet window preferably being arranged on the back side of the semiconductor substrate, i.e. on the side opposite to the avalanche region. This arrangement of the radiation inlet window has the advantage that the radiation to be detected is not shaded by the light-impermeable structures (e.g. connecting leads) on the side of the avalanche region.

The radiation inlet window for the radiation to be detected preferably has a substantially larger area than the avalanche region. This has the advantage that substantially more radiation can be detected than is incident directly on the avalanche region and the charge carriers generated by the incident radiation outside the avalanche region are preferably guided to the avalanche region by the afore-mentioned drift field to contribute to the avalanche formation there.

In addition, the avalanche region preferably has a semiconductor region buried in the semiconductor substrate and doped according to the first type of doping, wherein the buried semiconductor region can preferably be controlled by the control electrode. This buried semiconductor region determines the electric field strength in the avalanche region and thus the multiplication factor of the avalanche radiation detector according to the invention.

In one variant of the invention the doping of the buried semiconductor region varies in the lateral direction with regard to the doping strength and/or with regard to the depth extension. In this way, the electric field strength in the avalanche region can be influenced in the lateral direction in order to achieve a field strength distribution inside the avalanche region which is as uniform as possible.

The buried semiconductor region is preferably completely depleted to prevent charge carriers generated by the action of radiation in the photosensitive region from recombining in the buried semiconductor region, which would prevent detection. Outside the avalanche region, however, the buried semiconductor region is preferably only partly depleted so that the buried semiconductor region forms a barrier there for the charge carriers generated by the action of radiation.

The avalanche region preferably has a read-out electrode doped according to the second type of doping which preferably involves n-doping.

The read-out electrode of the avalanche region is preferably embedded in a lower-doped semiconductor region of the same type of doping. This offers the advantage that the dielectric strength in the region near the surface is reduced.

In this case, the doping of the read-out electrode and/or the semiconductor region in which the read-out electrode is embedded can vary in the lateral direction with regard to the doping strength and/or with regard to the depth expansion. This makes it possible to have a uniform field strength distribution in the lateral direction inside the avalanche region.

For the lateral variation of the doping it is possible that the read-out electrode or the semiconductor region in which said read-out electrode is embedded on the one hand and the buried semiconductor region on the other hand overlap partly in depth, their opposite doping being at least partly compensated.

It should further be noted that the buried semiconductor region in the semiconductor substrate can extend in the lateral direction down to below the control electrode. This has the result that the distance between the control electrode and the read-out electrode can be increased.

In this case, the control electrode can be directly conductively connected to the buried semiconductor region but it is also possible for the control electrode to be connected to the buried semiconductor region via a weak potential barrier.

A rear electrode is preferably arranged on the back side of the semiconductor substrate and therefore on the side opposite to the avalanche region to deplete the semiconductor substrate in charge carriers, the rear electrode preferably being doped according to the first type of doping and therefore generally exhibiting p-doping. The depletion of the semiconductor substrate in the photosensitive region is important otherwise available free charge carriers could trigger false detections.

It should furthermore be noted that an electric field with a potential barrier preferably exists in the semiconductor substrate, where the potential barrier prevents any emission of holes from the control electrode and/or from the rear electrode to the respectively opposing side of the semiconductor substrate.

The control electrode and the rear electrode can be at negative electric potential with respect to the read-out electrode to produce the potential barrier.

In this case, there is preferably a potential difference between the control electrode and the rear electrode which is so small that the potential barrier is located between the control electrode and the rear electrode.

It should furthermore be mentioned that the semiconductor substrate is in practice substantially more weakly doped than the buried semiconductor region, the read-out electrode, the rear electrode and/or the control electrode.

It should further be noted that the semiconductor substrate, the buried semiconductor region, the read-out electrode, the rear electrode and/or the control electrode can at least partly consist of silicon or germanium.

Finally, it is also possible to arrange a plurality of the avalanche radiation detectors according to the invention in one detector arrangement in a matrix form.

Other advantageous further developments of the invention are characterised in the dependent claims or are explained in detail hereinafter together with the description of the preferred exemplary embodiments with reference to the Figs.

DETAILED DESCRIPTION

Figure 1A:
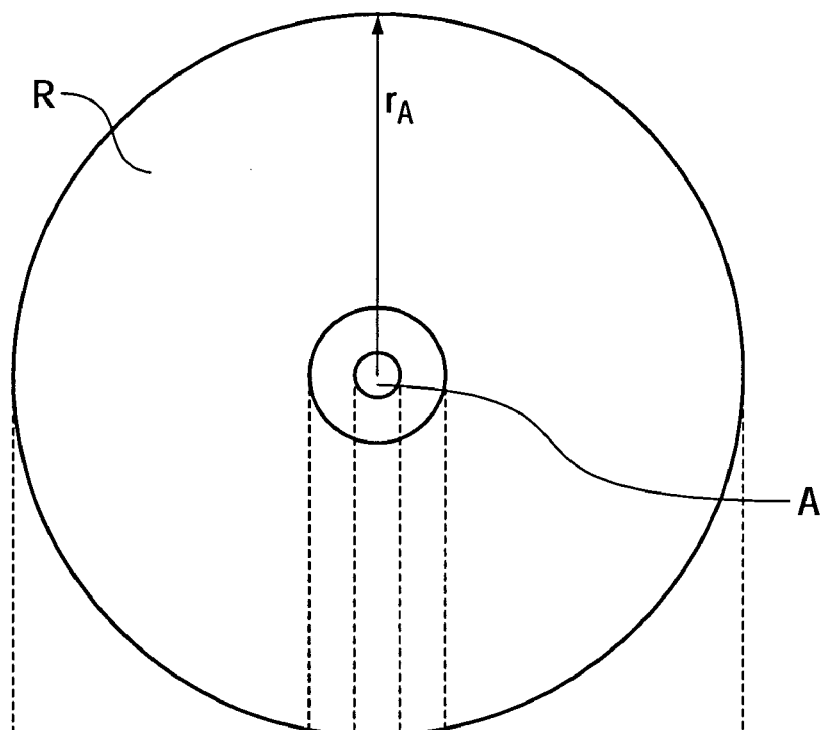
FIG. 1A is a plan view of an avalanche radiation detector according to the invention.
Figure 1B:
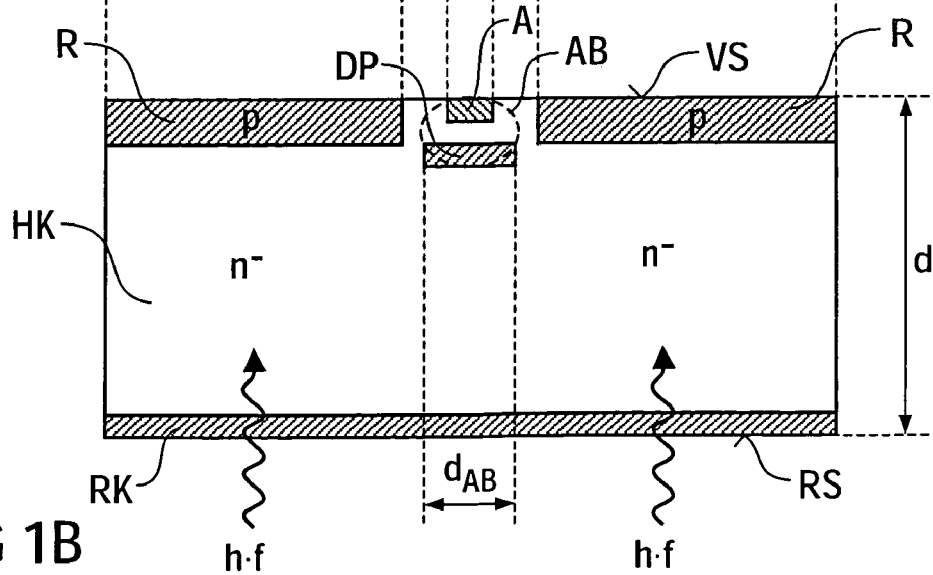
FIG. 1B is a cross-sectional view of the avalanche radiation detector from FIG. 1A.

The avalanche radiation detector shown in FIGS. 1A and 1B comprises a circular-disk-shaped, weakly n-doped silicon semiconductor substrate HK, said semiconductor substrate HK having a radius rA in the centimeter range and a thickness d in the range between 30 µm and 1 mm.

On its back side RS the semiconductor substrate HK has a p-doped rear electrode RK to deplete said semiconductor substrate HK in charge carriers.

The back side RS of the semiconductor substrate HK also forms a radiation inlet window via which the radiation to be detected enters into the semiconductor substrate HK and there generates charge carriers.

On its front side VS the semiconductor substrate HK has a p-doped ring-shaped control electrode R which surrounds an avalanche region AB in a ring shape, said avalanche region AB being arranged on the front side VS near the surface in the semiconductor substrate HK. The avalanche region AB can have a diameter $d_{AB}$ in the micron range, where a value of $d_{AB}=10$ µm has proved to be advantageous. The small dimensions of the avalanche region AB in the avalanche radiation detector according to the invention advantageously make it possible to achieve favourably priced manufacture compared with larger avalanche structures.

In this case, the avalanche region AB has a buried p-doped semiconductor region DP and an n-doped read-out electrode A, where the buried semiconductor region DP is controlled by the control electrode R.

In addition, the control electrode R produces an electric drift field in the semiconductor substrate HK which guides the electrons generated in the semiconductor substrate HK by the action of radiation to the avalanche region AB where the signal electrons result in the formation of an avalanche which is detected via the read-out electrode A. The drift field makes it possible for the radiation inlet window and the photosensitive region in the semiconductor substrate HK to be substantially larger than the avalanche region AB. The avalanche radiation detector according to the invention thus combines the advantage of a high sensitivity as a result of the large radiation inlet window and the large-volume photosensitive region with the advantage of inexpensive conventional manufacture since the avalanche region AB is relatively small.

To operate this avalanche radiation detector, electric voltages are applied to the read-out electrode A, the control electrode R and the rear electrode RK so that the semiconductor substrate HK including the buried semiconductor region DP is completely depleted in charge carriers and a potential barrier is formed in the semiconductor substrate which prevents any emission of holes from the p-doped control electrode R or from the likewise p-doped rear electrode RK to the opposite side of the semiconductor substrate HK.

This state is achieved if both the rear electrode RK and also the control electrode R are at a negative potential with respect to the read-out electrode A, the potential difference between the control electrode R and the rear electrode RK being limited so that a potential maximum is maintained between them that acts as a barrier for the emission of holes.

The signal electrons produced in the depleted semiconductor substrate HK are then guided via this potential maximum to the avalanche region AB.

The electric field strength in the avalanche region AB is determined by the doping strength and depth of the buried, doped semiconductor region DP and can be additionally varied by the voltage applied between the read-out electrode A and the control electrode R.

The potential at the rear electrode RK also influences the electric field strength in the avalanche region AB, whereas, as a result of the larger distance from the avalanche region AB the influence of the rear electrode RK is smaller than the influence of the directly adjacent control electrode R.

This exemplary embodiment advantageously makes it possible to have a large radiation inlet window and a large-volume photosensitive region with a relatively small avalanche region. In this case, the large radiation inlet window and the large-volume photosensitive region contribute to the high sensitivity of the avalanche radiation detector whereas the relatively small avalanche region limits the manufacturing expenditure since large-area avalanche structures can only be manufactured with difficulty.

Figure 2:
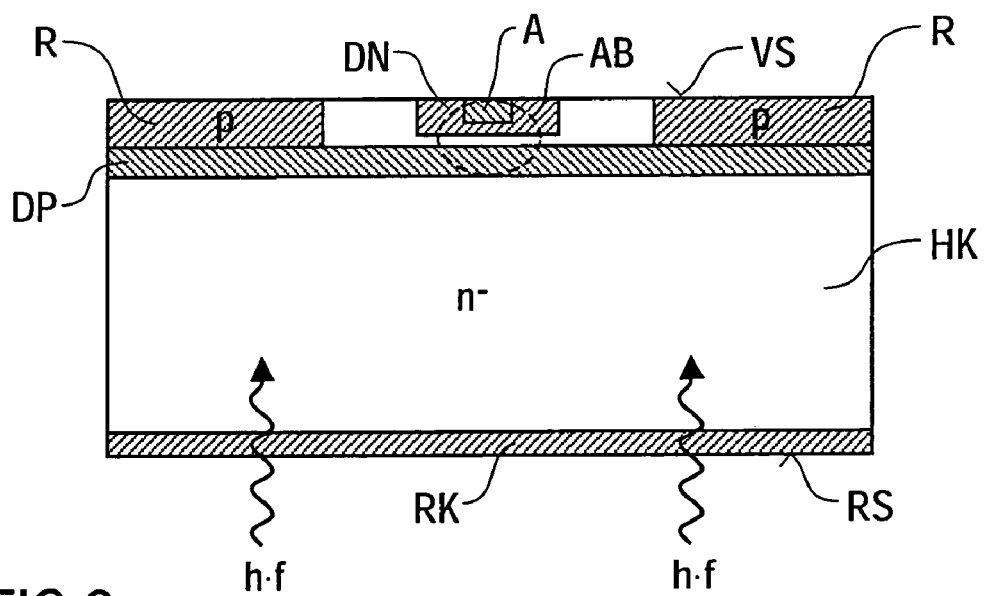
FIG. 2 is a cross-sectional view of an alternative exemplary embodiment of an avalanche radiation detector according to the invention with a buried semiconductor region which extends laterally as far as under the control electrode.

The exemplary embodiment of an avalanche radiation detector according to the invention shown in FIG. 2 largely corresponds to the exemplary embodiment described hereinbefore and shown in FIGS. 1A and 1B so that to avoid repetitions reference is largely made to the preceding description relating to FIGS. 1A and 1B and the same reference symbols will be used for corresponding regions in the following.

A particular feature of this exemplary embodiment is that the strongly n-doped read-out electrode A in this case is embedded in a more weakly n-doped semiconductor region DN.

In addition, the buried p-doped semiconductor region DP is drawn outwards in the lateral direction as far as the control electrode R and is connected thereto.

On the one hand, this arrangement has the result that the distance between the control electrode R and the read-out electrode A can be enlarged.

On the other hand, the dielectric strength in the avalanche region AB is reduced in this way near the surface.

In this case, however, the buried p-doped semiconductor region DP is not depleted over its entire surface but only below the avalanche region AB. In this case, the negative potential of the control electrode R is no longer brought over the ring-shaped control electrode R itself to the avalanche region AB but via the buried p-doped semiconductor region DP. In this way, the signal electrons formed in the semiconductor substrate HK as a result of the action of radiation are focussed in the direction of the avalanche region AB.

The exemplary embodiment of an avalanche radiation detector according to the invention shown in FIG. 3 also largely corresponds to the exemplary embodiment described hereinbefore and shown in FIGS. 1A and 1B so that to avoid repetitions reference is largely made to the preceding description relating to FIGS. 1A and 1B and the same reference symbols will be used for corresponding regions in the following.

This exemplary embodiment is based on the knowledge that it is desirable for the formation of the electric field in the avalanche region AB to be as uniform as possible which is not optimally implemented in the preceding exemplary embodiments. Thus, in the previous exemplary embodiment a higher field strength is to be expected at the edge of the avalanche region AB than in the centre of said avalanche region AB. Even if the signal electrons generated in the semiconductor substrate HK by the action of the radiation run exclusively centrally through the avalanche region AB, the non-uniform field strength in the avalanche region AB is disadvantageous in the preceding exemplary embodiments.

If the preceding exemplary embodiments are operated in the proportional mode for example, the maximum electric field strength and thus the charge multiplication factor are limited by the conditions at the edge of the avalanche region AB since an avalanche breakdown must be prevented there.

On the other hand, if the avalanche radiation detector is to be operated in the so-called Geiger mode where the charge carrier avalanche is extinguished by reducing the applied voltage, a substantially greater reduction in voltage is required because the charge carrier avalanche originally triggered in the central area of the avalanche region AB propagates into the outer avalanche region AB and must also come to a standstill there.

Figure 3:
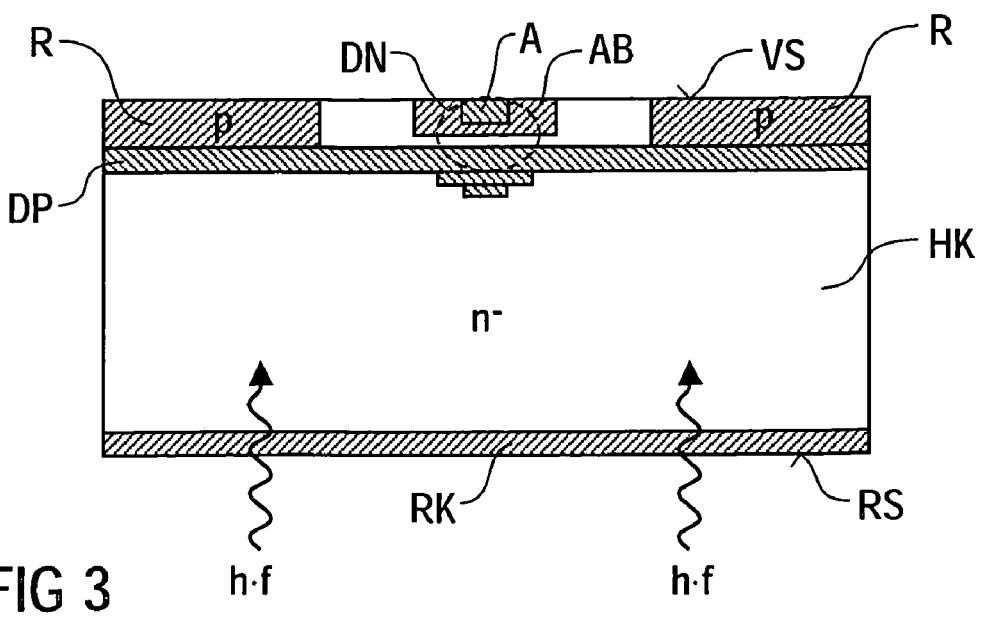
FIG. 3 is another alternative exemplary embodiment of an avalanche radiation detector according to the invention where the doping of the buried semiconductor region varies in the lateral direction.

These problems are solved in the exemplary embodiment according to FIG. 3 by the fact that the doping of the buried p-doped semiconductor region varies underneath the avalanche region AB in the lateral direction. This doping variation can be achieved, for example, by structured implantations where not only the geometric expansion but also the dose and energy (depth) can be varied.

Figure 4:
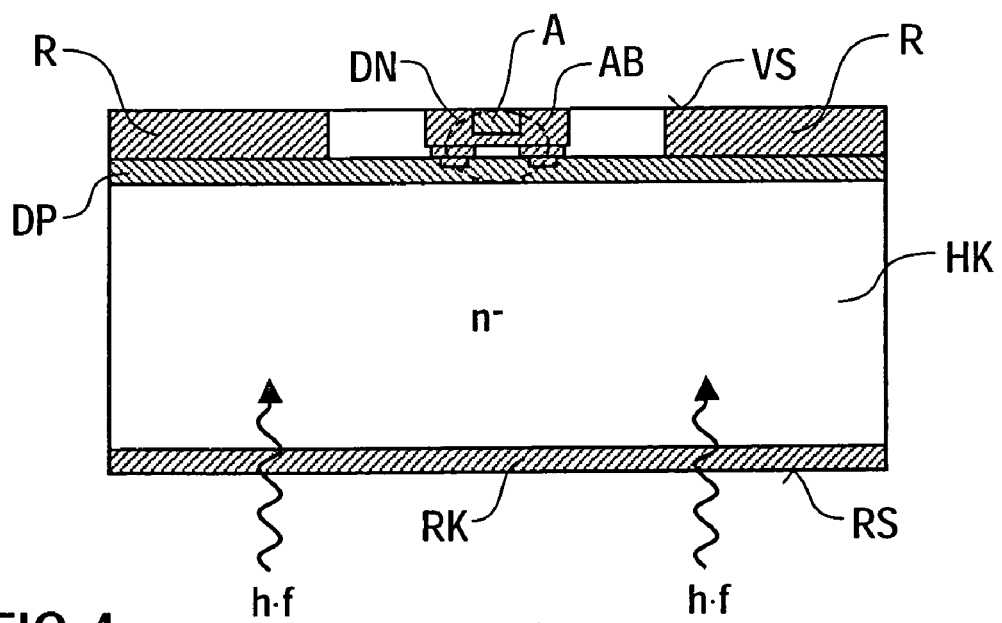
FIG. 4 is another alternative exemplary embodiment of an avalanche radiation detector according to the invention where the read-out electrode is embedded in a semiconductor region whose doping varies in the lateral direction.

The exemplary embodiment shown in FIG. 4 also largely corresponds to the exemplary embodiments described hereinbefore so that to avoid repetitions reference is largely made to the preceding description and the same reference symbols will be used for corresponding regions in the following.

In this case, however, the uniformity of the electric field strength within the avalanche region AB is not achieved by a lateral doping variation within the buried p-doped semiconductor region DP but by a doping variation in the n-doped semiconductor region DN in which the read-out electrode A is embedded. In this case, the electric field strength at the edge of the avalanche region AB is reduced by partial compensation by means of a structuring of the deep n-doping of the semiconductor region DN whose offshoots overlap with the buried p-doped semiconductor region DP.

Figure 5:
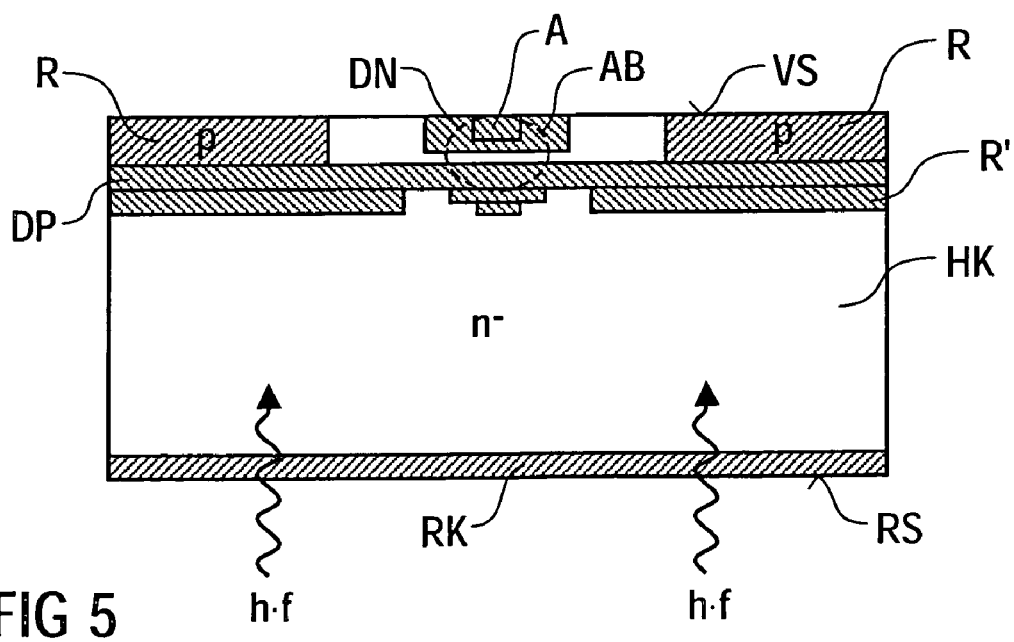
FIG. 5 is a further exemplary embodiment of an avalanche radiation detector according to the invention wherein the doping of the buried semiconductor region varies in the lateral direction.

The exemplary embodiment of an avalanche radiation detector according to the invention shown in FIG. 5 again largely corresponds to the exemplary embodiment described hereinbefore so that to avoid repetitions reference is largely made to the preceding description and the same reference symbols will be used for corresponding regions in the following.

To improve the focussing properties of the signal electrons, a ring-shaped buried p-doped ring electrode R' is additionally provided here, which is arranged underneath the buried p-doped semiconductor region DP. The electric potential of the control electrode R is thereby brought closer to the avalanche region AB whereby the control effect of the control electrode R on the avalanche region AB is increased. The requirements for precisely maintaining the required doping of the buried p-doped semiconductor region DP are thereby reduced since deviations can be compensated more easily by changes in the electric potential applied to the control electrode. In the Geiger mode the voltage reduction required to extinguish the charge carrier avalanche is reduced.

Figure 6:
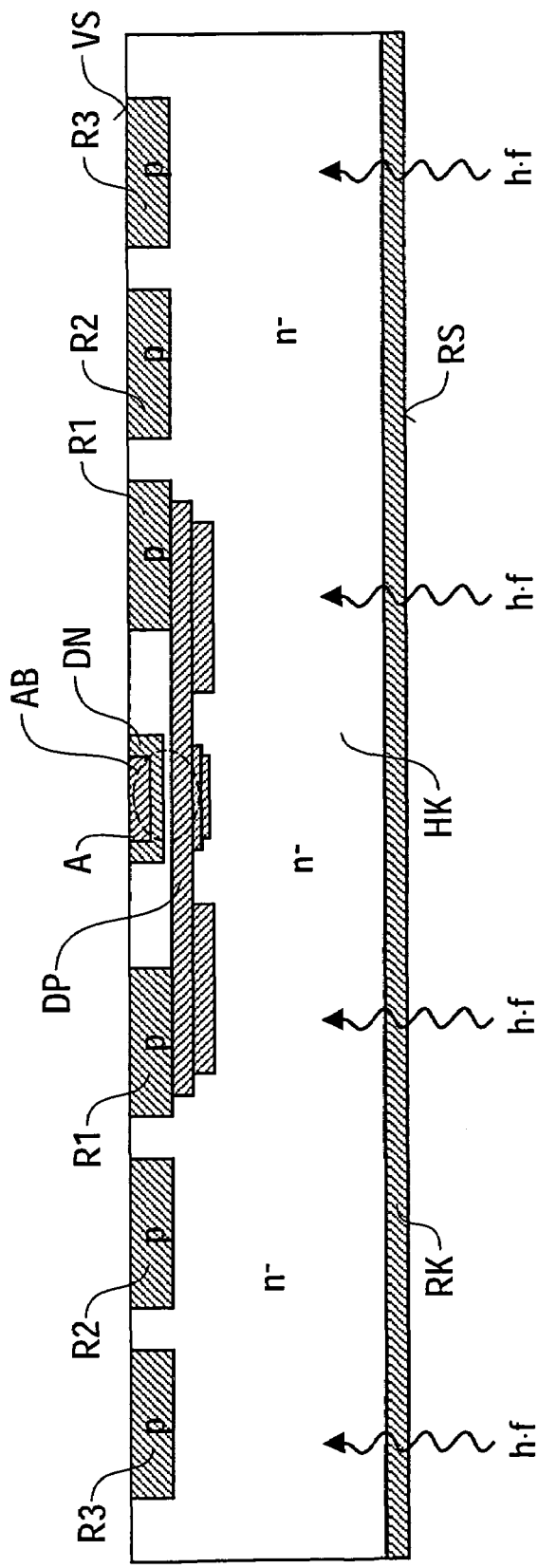
FIG. 6 is a cross-sectional view of a further exemplary embodiment of an avalanche radiation detector according to the invention comprising a plurality of ring-shaped and concentrically arranged control or collector electrodes.

The exemplary embodiment of an avalanche radiation detector according to the invention shown in FIG. 6 also largely corresponds to the exemplary embodiment described hereinbefore so that to avoid repetitions reference is largely made to the preceding description and the same reference symbols will be used for corresponding regions in the following.

A particular feature of this exemplary embodiment is that the avalanche region AB in this case is surrounded by a plurality of ring electrodes R1, R2, R3 which generate a drift field in the semiconductor substrate HK which guides the signal electrons formed in the semiconductor substrate HK by the action of radiation to the avalanche region AB. For this purpose the individual ring electrodes R1, R2, R3 are at different outwardly decreasing electric potentials.

The avalanche radiation detector thereby has a very large collector surface for the radiation to be detected with a small expansion of the avalanche region AB where the time resolution for the detection is determined by the maximum drift time.

Figure 7:
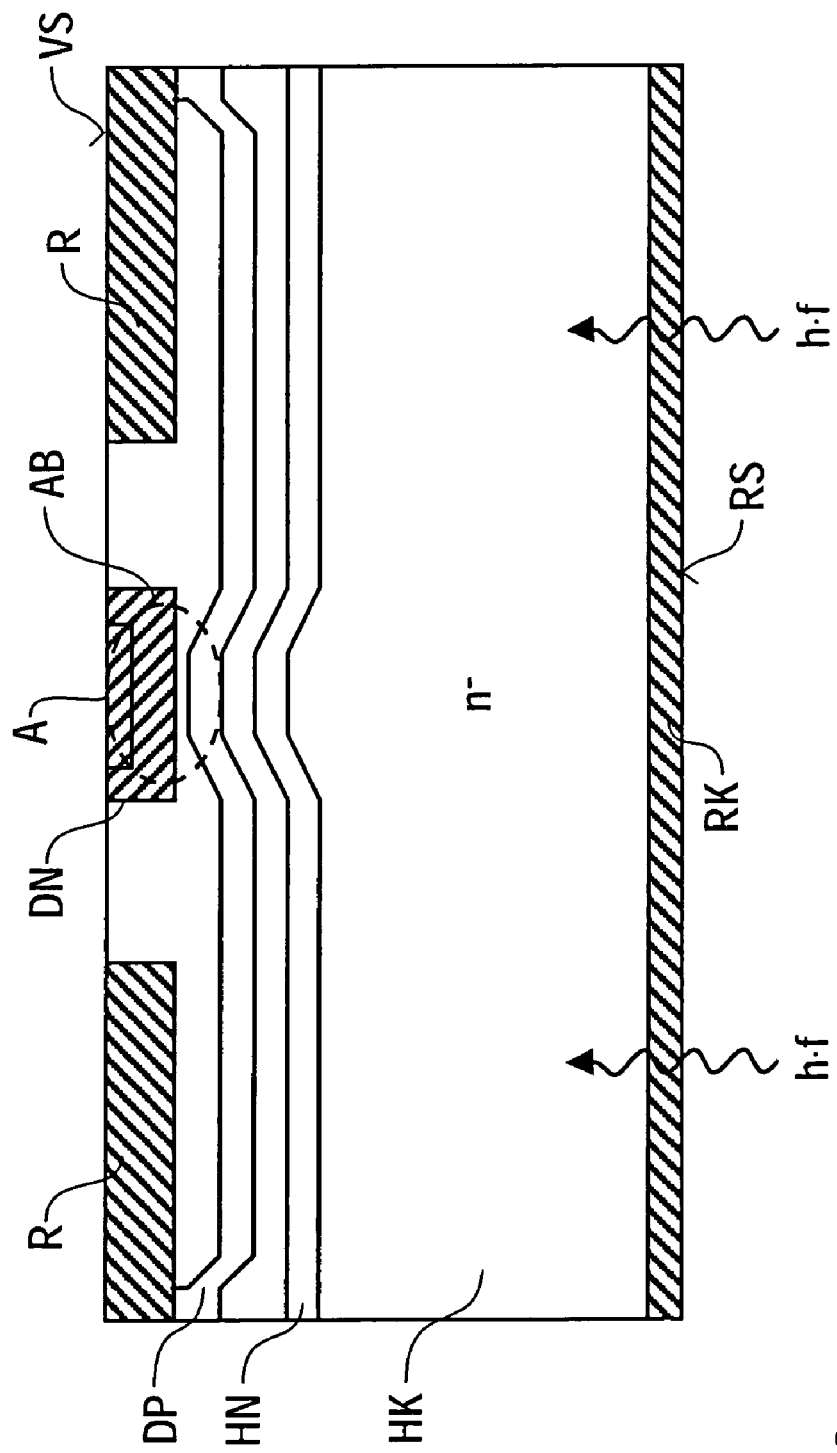
FIG. 7 is a cross-sectional view of a further exemplary embodiment of an avalanche radiation detector according to the invention with an additional n-implantation.

The exemplary embodiment of an avalanche radiation detector according to the invention shown in FIG. 7 largely corresponds to the exemplary embodiment described hereinbefore so that to avoid repetitions reference is largely made to the preceding description and the same reference symbols will be used for corresponding regions in the following.

Compared with the exemplary embodiments shown previously the buried p-doped semiconductor region DP is arranged over most of the structure at a larger distance from the front side VS. In the avalanche region AB however, the buried p-doped semiconductor region DP is again brought closer to the front side VS. This has the result that the high-field region is restricted to this near region. At the same time complete depletion of the buried p-doped semiconductor region DP outside this near region is prevented and the potential of the control electrode R is put through close to the avalanche region AB.

In addition to the examples shown previously, FIG. 7 also contains an additionally buried n-implantation HN which prevents the emission of holes (p) from the control electrode R to the rear electrode RK arranged on the back side RS. The n-implantation can also vary in depth and in relative distance from the deep p-doped semiconductors region DP. If this distance DP-HN is reduced in the avalanche region AB, or the depth sequence of DP and HN is inverted in this region, the barrier brought about by this n-implantation HN for the collection of signal electrons is reduced. This effect can be used to focus signal electrons into the centre of the avalanche region AB.

The invention is not restricted to the exemplary embodiments shown previously. Rather, a plurality of variants and modifications are possible which also make use of the inventive idea and thus come within the scope of protection as set forth in the appended claims.

We claim:

1. In an avalanche radiation detector comprising
    a semiconductor substrate with a front side and a back side,
    an avalanche region which is arranged in the semiconductor substrate on the front side of the semiconductor substrate,
    a control electrode for adjusting the electric field strength in the avalanche region,
    a read-out contact arranged on the front side and
    a radiation inlet window for the radiation to be detected, arranged on the back side of the semiconductor substrate;
    the improvement comprising:
    the control electrode being arranged on the front side of the semiconductor substrate.

2. The avalanche radiation detector according to claim 1, characterised in that the control electrode surrounds the avalanche region in a ring shape.

3. The avalanche radiation detector according to claim 1, characterised by an electric drift field in the semiconductor substrate which moves the radiation-generated charge carriers inside the semiconductor substrate to the avalanche region.

4. The avalanche radiation detector according to claim 1, characterised in that the control electrode is doped according to a first type of doping whereas the semiconductor substrate is doped according to an opposite second type of doping.

5. The avalanche radiation detector according to claim 1, characterised in that the radiation inlet window has a substantially larger area than the avalanche region.

6. The avalanche radiation detector according to claim 1, characterised in that a photosensitive region is located in the semiconductor substrate wherein charge carriers are generated by the radiation to be detected, wherein the photosensitive region is substantially at least one of larger in area, larger in volume, thicker and broader than the avalanche region.

7. The avalanche radiation detector according to claim 4, characterised in that the avalanche region has a semiconductor region buried in the semiconductor substrate and doped according to the first type of doping, wherein the buried semiconductor region can be controlled by the control electrode.

8. The avalanche radiation detector according to claim 7, characterised in that the doping of the buried semiconductor region varies in the lateral direction with regard to at least one of the doping strength and the depth extension.

9. The avalanche radiation detector according to claim 7, characterised in that the buried semiconductor is depleted in the avalanche region and is only partially depleted outside the avalanche region.

10. The avalanche radiation detector according to claim 4, characterised in that the avalanche region has a read-out contact which is doped according to the second type of doping.

11. The avalanche radiation detector according to claim 10, characterised in that the read-out contact is embedded in a lower doped semiconductor region of the same doping type.

12. The avalanche radiation detector according to claim 10, characterised in that at least one of the doping of the read-out contact and the semiconductor region in which the read-out contact is embedded varies in the lateral direction with regard to the doping strength and/or with regard to the depth extension.

13. The avalanche radiation detector according to claim 11, characterised in that at least one of the read-out contact and the semiconductor region in which the read-out contact is embedded on the one hand and the buried semiconductor region on the other hand partially overlap in the lateral direction, wherein their opposite doping is at least partly compensated.

14. The avalanche radiation detector according to claim 7, characterised in that the buried semiconductor region in the semiconductor substrate extends as far as below the control electrode.

15. The avalanche radiation detector according to claim 7, characterised in that the buried semiconductor region is connected to the control electrode.

16. The avalanche radiation detector according to claim 4, characterised in that a rear electrode is arranged on the back side of the semiconductor substrate to deplete the semiconductor substrate, wherein the rear electrode is doped according to the first doping type.

17. The avalanche radiation detector according to claim 1, characterised in that the avalanche region is surrounded by a plurality of collector electrodes which generate a drift field in the semiconductor substrate, which is directed onto the avalanche region.

18. The avalanche radiation detector according to claim 17, characterised in that the collector electrodes surround the avalanche region in a ring shape and substantially concentrically.

19. The avalanche radiation detector according to claim 7, characterised in that the semiconductor substrate and the buried semiconductor region are completely depleted in charge carriers.

20. The avalanche radiation detector according to claim 1, characterised in that an electric field with a potential barrier exists in the semiconductor substrate, wherein the potential barrier prevents any emission of holes from at least one of the control electrode and the rear electrode to the respectively opposing side of the semiconductor substrate.

21. The avalanche radiation detector according to claim 20, characterised in that the control electrode and the rear electrode are at a negative electric potential with respect to the read-out contact to produce the potential barrier.

22. The avalanche radiation detector according to claim 20, characterised in that a potential difference exists between the control electrode and the rear electrode which is so small that the potential barrier is located between the control electrode and the rear electrode.

23. The avalanche radiation detector according to claim 7, characterised in that the semiconductor substrate is substantially more weakly doped than the buried semiconductor region, the read-out contact, the rear electrode and/or the control electrode.

24. The avalanche radiation detector according to claim 7, characterised in that the semiconductor substrate, the buried semiconductor region, the read-out contact, and at least one of the rear electrode and the control electrode consists at least partly of silicon or germanium.

25. The avalanche radiation detector according to claim 4, characterised in that the first doping type corresponds to p-doping whereas the second doping type corresponds to n-doping.

26. The avalanche radiation detector according to claim 4, characterised in that the first doping type corresponds to n-doping whereas the second doping type corresponds to p-doping.

27. A detector arrangement comprising a plurality of avalanche radiation detectors according to any one of the claim 1, 4, 7 or 20, wherein the avalanche radiation detectors are arranged in a matrix form.

* * * * *